United States Patent
Jung et al.

(10) Patent No.: US 7,202,174 B1
(45) Date of Patent: Apr. 10, 2007

(54) METHOD OF FORMING MICRO PATTERN IN SEMICONDUCTOR DEVICE

(75) Inventors: Woo Young Jung, Seoul (KR); Sung Yoon Cho, Suwon-si (KR); Choi Dong Kim, Icheon-si (KR); Pil Keun Song, Seongnam-si (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/361,520

(22) Filed: Feb. 23, 2006

(30) Foreign Application Priority Data

Feb. 2, 2006 (KR) ...................... 10-2006-0010154

(51) Int. Cl.
 *H01L 21/311* (2006.01)
(52) U.S. Cl. ...................... 438/694; 438/702
(58) Field of Classification Search ................ 438/692, 438/694, 696, 699, 700, 702, 703, 719, 723, 438/724
See application file for complete search history.

(56) References Cited

U.S. PATENT DOCUMENTS

| | | | |
|---|---|---|---|
| 5,013,680 A * | 5/1991 | Lowrey et al. ............. | 438/242 |
| 6,180,973 B1 * | 1/2001 | Ozaki ......................... | 257/305 |
| 6,835,662 B1 * | 12/2004 | Erhardt et al. .............. | 438/689 |
| 6,955,961 B1 * | 10/2005 | Chung ........................ | 438/241 |
| 2005/0142497 A1 * | 6/2005 | Ryou et al. ................. | 430/311 |

* cited by examiner

*Primary Examiner*—Kin-Chan Chen
(74) *Attorney, Agent, or Firm*—Marshall, Gerstein & Borun LLP

(57) ABSTRACT

A method of forming a micro pattern in a semiconductor device, wherein a first polysilicon film, a buffer oxide film, a second polysilicon film, an anti-polishing film, and a first oxide film are sequentially laminated on a semiconductor substrate having a to-be-etched layer. The first oxide film, the anti-polishing film and the second polysilicon film are patterned. After nitride film spacers are formed on the patterned lateral portions, a second oxide film is formed on the entire structure. A Chemical Mechanical Polishing (CMP) process is performed using the anti-polishing film as a stopper. Thereafter, after the nitride film spacers are removed, the second oxide film and the second polysilicon film are removed using a difference in etch selective ratio between the oxide film and the polysilicon film. A hard mask for forming a micro pattern having a structure in which the first polysilicon film and the buffer oxide film are laminated is formed. The to-be-etched layer is etched using the hard mask as an etch barrier.

16 Claims, 6 Drawing Sheets

METHOD OF FORMING MICRO PATTERN IN SEMICONDUCTOR DEVICE

BACKGROUND OF THE INVENTION

1. Field of the Invention

The invention relates generally to a method of manufacturing semiconductor devices and, more particularly, to a method of forming a micro pattern in a semiconductor device, in which a micro pattern has a pitch lower than the resolution capability of the exposure apparatus.

2. Discussion of Related Art

In manufacturing semiconductor devices, the minimal pitch of a pattern formed in the photolithography process is determined by the waveform of exposure radiation used. Therefore, to form patterns having smaller pitch as semiconductor devices become increasingly integrated, radiation having a waveform shorter than that of the radiation that is currently used must be used. To this end, it may be preferred that X-ray or E-beam be used. However, the use of X-ray or E-beam has not yet been commercialized due to technical problems, productivity, etc. In view of the above, a Dual Exposure and Etch Technology (DEET) has been proposed.

FIGS. 1a to 1c are views illustrating dual exposure etch technology. As shown in FIG. 1a, a first photoresist PR1 is coated on a semiconductor substrate 10 having a to-be-etched layer 1. After the first photoresist PR1 is patterned by exposure and development processes, the to-be-etched layer 11 is etched using the patterned first photoresist PR1 as a mask. The etched to-be-etched layer 11 has a line width of 150 nm and a space width of 50 nm.

Thereafter, the first photoresist PR1 is stripped and a second photoresist PR2 is then coated on the entire structure. The second photoresist PR2 is patterned by exposure and development processes so that some of the to-be-etched layer 11 is exposed as shown in FIG. 1b.

As shown in FIG. 1c, the to-be-etched layer 11 is again etched using the patterned second photoresist PR2 as a mask, thus forming a final pattern whose line and space width is 50 nm. The second photoresist PR2 is then stripped.

In the above-described dual exposure etch technology, during the exposure process of the second photoresist PR2, the overlay accuracy is directly related to Critical Dimension (CD) variation of the last pattern. In practice, since the overlay accuracy of the exposure apparatus is difficult to control to 10 nm or less, it is difficult to reduce the CD variation of the last pattern. It is also difficult to control Optical Proximity Correction (OPC) through the separation of circuits depending on exposure.

SUMMARY OF THE INVENTION

The invention provides a method of forming a micro pattern in a semiconductor device in which the CD variation of a pattern can be reduced.

A method of forming a micro pattern in a semiconductor device according to one aspect of the invention includes the steps of (a) sequentially forming a first polysilicon film and a buffer oxide film overlaying the first polysilicon film on a semiconductor substrate having a to-be-etched layer, and forming a hard mask having a structure in which a second polysilicon film, an anti-polishing film and a first oxide film are laminated on a predetermined region of the buffer oxide film, (b) forming nitride film spacers on lateral portions of the hard mask and forming a second oxide film on the entire structure, (c) polishing the second oxide film, the nitride film spacers and the first oxide film so that the anti-polishing film is exposed, and removing the anti-polishing film and the nitride film spacers, (d) etching the buffer oxide film using the second polysilicon film and the second oxide film as masks and removing the second oxide film, (e) etching the first polysilicon film using the second polysilicon film and the buffer oxide film as masks and removing the second polysilicon film, and (f) etching the to-be-etched layer using the buffer oxide film and the first polysilicon film as masks.

The method may further include the step (g) of removing a predetermined portion of the buffer oxide film, which is formed in a portion in which a pattern should not be formed, between step (d) and step (e).

Step (g) may include the steps of (g1) sequentially forming a second anti-reflection film and a second photoresist overlaying the second anti-reflection film on the entire structure, (g2) patterning the second photoresist so that the second anti-reflection film on the buffer oxide film, which is formed in the portion in which the pattern should not be formed, is exposed, (g3) etching the second anti-reflection film and the buffer oxide film using the patterned second photoresist as a mask, and (g4) removing the second photoresist and the second anti-reflection film.

The method may further include the step of forming a protection layer for protecting the underlying to-be-etched layer before the first polysilicon film is formed. The protection layer may be formed to a thickness of 200 Å to 400 Å using a SiON film.

The method may further include the step of forming a first α-carbon film before the protection layer is formed. The first α-carbon film may be formed to a thickness of 150 Å to 2500 Å.

The first polysilicon film is typically formed to a thickness of 500 Å to 600 Å and the second polysilicon film is typically formed to a thickness of 500 Å to 700 Å. The buffer oxide film is typically formed to a thickness of 400 Å to 500 Å and the first oxide film is typically formed to a thickness of 800 Å to 1000 Å. Furthermore, the anti-polishing film is typically formed to a thickness of 200 Å to 400 Å using a SiON film.

The hard mask may be formed using the steps of sequentially forming the second polysilicon film, the anti-polishing film over the second polysilicon film, and the first oxide film over the anti-polishing film on the entire surface of the buffer oxide film, forming a second α-carbon film on the first oxide film, coating a first photoresist on the second α-carbon film and patterning the first photoresist, etching the second α-carbon film, the first oxide film, the anti-polishing film, and the second polysilicon film using the patterned first photoresist as a mask, and removing the first photoresist and the second α-carbon film that remain after the etch process.

The method may further include the step of sequentially forming a second protection layer and an anti-reflection film over the second protection layer before the first photoresist is coated.

The second protection layer is typically formed to a thickness of 200 Å to 400 Å using a SiON film, and the anti-reflection film is typically formed to a thickness of 200 Å to 400 Å.

In step (c), the anti-polishing film may be first removed by an excessive polishing process and the nitride film spacers may be then removed.

In the step (c), the anti-polishing film and the nitride film spacers may be removed at the same time.

DETAILED DESCRIPTION OF PREFERRED EMBODIMENTS

The invention will now be described in connection with preferred embodiments with reference to the accompanying drawings.

Since preferred embodiments are provided for the purpose that the ordinary skilled in the art are able to understand the invention, they may be modified in various manners and the scope of the invention is not limited by the preferred embodiments described later.

FIGS. 2a to 2k are cross-sectional view illustrating a process of forming a micro pattern in a semiconductor device according to an embodiment of the invention. FIG. 2 shows an example in which the invention is applied to the gate etch process of a flash memory device.

Figure 1A:
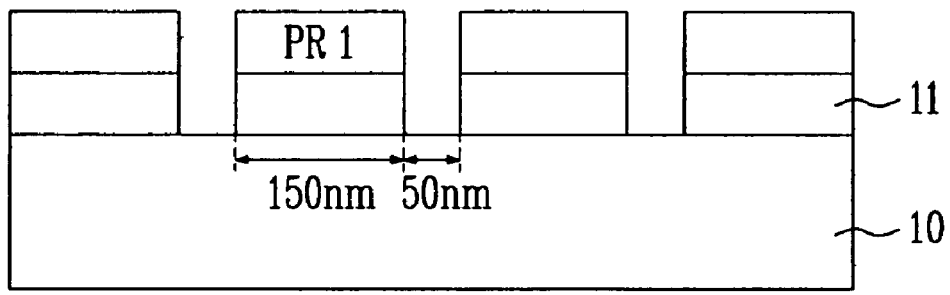
FIGS. 1a to 1c are views illustrating prior art dual exposure etch technology.
Figure 1B:
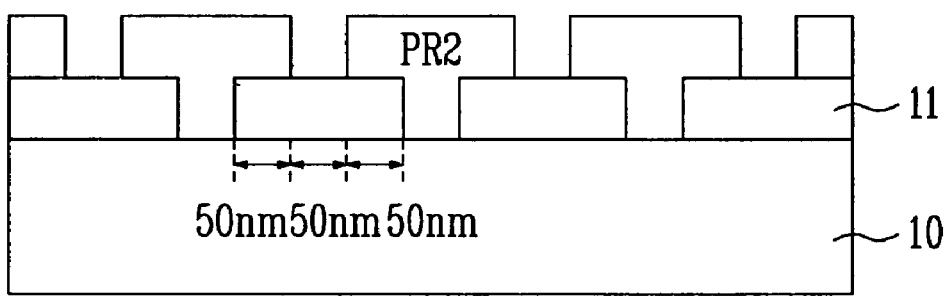
Figure 1C:
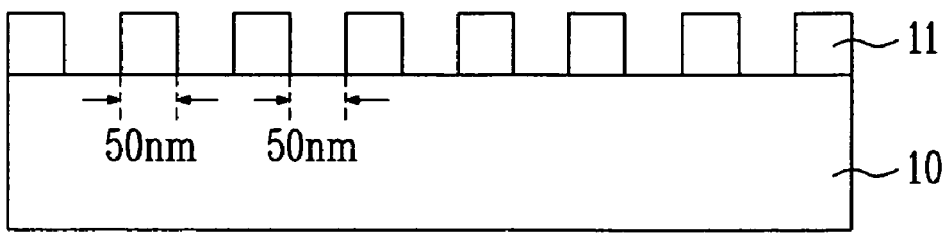
Figure 2A:
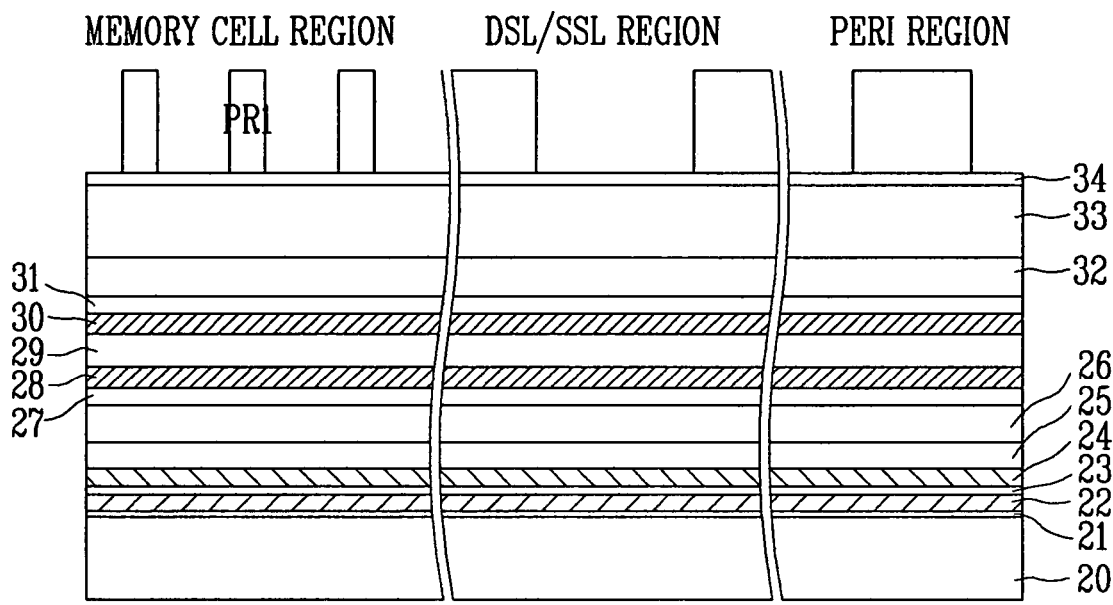
FIGS. 2a to 2k are cross-sectional views illustrating a process of forming a micro pattern in a semiconductor device according to an embodiment of the invention.

Referring first to FIG. 2a, a tunnel oxide film 21 (i.e., a to-be-etched layer), a floating gate conduction film 22, a dielectric film 23, a control gate conduction film 24 and a hard mask nitride film 25 are sequentially formed on a semiconductor substrate 20 hard memory cell region where a memory cell transistor will be formed, a Drain Selective Line (DSL)/Source Selective Line (SSL) region where a DSL and a SSL will be formed, and a peri region where peripheral circuits will be formed.

The hard mask nitride film 25 is for a self-aligned contact process and is typically formed to a thickness of 2000 Å to 3000 Å. In this case, before the control gate conduction film 24 is formed, the dielectric film 23 formed in the DSL/SSL region and the peri region is removed such that the floating gate conduction film 22 and the control gate conduction film 24 can operate as a single gate.

A first polysilicon film 28 and a buffer oxide film 29 are then sequentially formed on the entire structure. The first polysilicon film 28 is typically formed to a thickness of 500 Å to 600 Å and the buffer oxide film 29 is typically formed to a thickness of 400 Å to 500 Å, preferably using a Tetra Ethyl Ortho Silicate (TEOS) oxide film.

In this case, before the first polysilicon film 28 is formed, a first α-carbon film 26 and a first protection layer 27 can be further formed. The first α-carbon film 26 is formed to supplement the shortage of an etch margin when the hard mask nitride film 25 is subsequently etched, and it is typically formed to a thickness of 1500 Å to 2500 Å. The first protection layer 27 functions to protect a lower layer during the etch process of an upper layer and is typically formed to a thickness of 200 Å to 400 Å using a SiON film.

Thereafter, a second polysilicon film 30, an anti-polishing film 31 and a first oxide film 32 are sequentially formed on the buffer oxide film 29. The second polysilicon film 30 is typically formed to a thickness of 500 Å to 700 Å, the anti-polishing film 31 is typically formed to a thickness of 200 Å to 400 Å using a SiON film, and the first oxide film 32 is typically formed to a thickness of 800 Å to 1000 Å using a TEOS oxide film.

A second α-carbon film 33 and a second protection layer 34 are then sequentially formed on the first oxide film 32. A first photoresist PR1 is coated on the second protection layer 34. The second α-carbon film 33 is a film additionally formed in order to supplement the shortage of an etch margin of the first photoresist PR1 when etching the first oxide film 32, the anti-polishing film 31 and the second polysilicon film 30. The second protection layer 34 is typically formed to a thickness of 200 Å to 400 Å using a SiON film and the photoresist PR is typically formed to a thickness of about 1800 Å.

Meanwhile, although not shown in the drawings, before the first photoresist PR1 is coated, an anti-reflection film preferably having a thickness of 200 Å to 400 Å is typically formed on the second protection layer 34.

The first photoresist PR1 is then patterned typically by exposure and development processes. At this time, the patterning process is typically controlled so that the line CD of the first photoresist PR1 formed in the memory cell region becomes 65 nm to 75 nm and the space CD thereof becomes 115 nm to 125 nm.

Figure 2B:
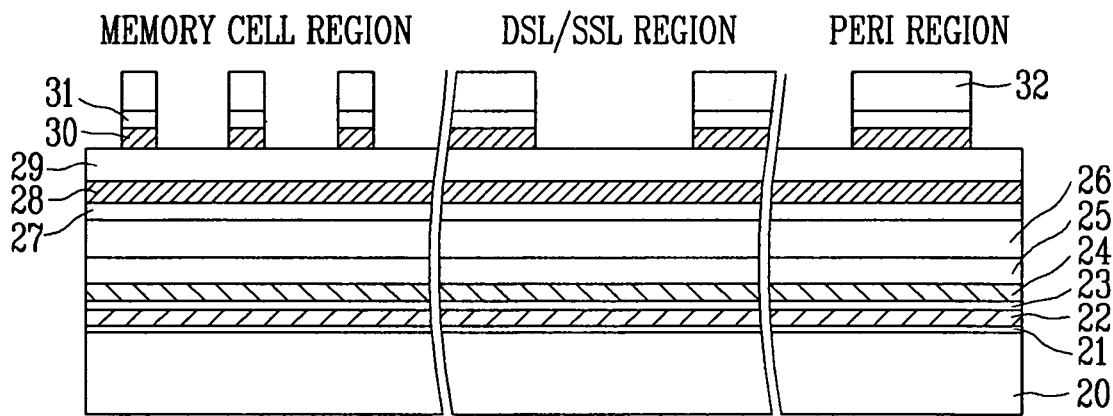

Thereafter, as shown in FIG. 2b, the second protection layer 34, the second α-carbon film 33, the first oxide film 32, the anti-polishing film 31 and the second polysilicon film 30 are etched using the patterned first photoresist PR1 as a mask. At this time, a line CD bias is typically controlled to 5 nm to 15 nm such that the CD of each of the etched second polysilicon film 30, the etched anti-polishing film 31 and the etched first oxide film 32 is typically 5 nm to 15 nm smaller than that of the first photoresist PR1.

If the process is performed as described above, a pattern with a size smaller than the resolution capability of the exposure apparatus can be formed although the first photoresist PR1 is patterned to have a size within the resolution capability of the exposure apparatus.

If the thickness of the second α-carbon film 33 is small, it is difficult to secure the line CD bias at the time of the etch process. Therefore, the second α-carbon film 33 must have a predetermined thickness, e.g., 1500 Å to 2500 Å. Meanwhile, the first photoresist PR1 is also removed at the time of the etch process. Although the first photoresist PR1 is completely removed, the underlying second α-carbon film 33 serves as an etch mask against the first oxide film 32, the anti-polishing film 31 and the second polysilicon film 30. Accordingly, attack against the first oxide film 32 below the first photoresist PR1 can be prevented.

Figure 2C:
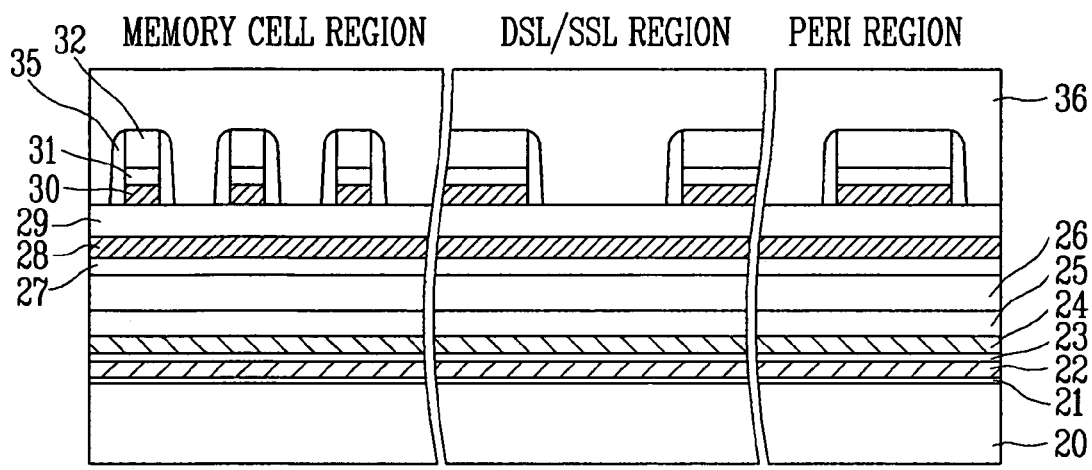

Films remaining on the first oxide film 32, including the second α-carbon film 33, are then removed. A nitride film typically having a thickness of 40 Å to 50 Å is deposited on the entire structure, as shown in FIG. 2c, and is then etched back to form nitride film spacers 35 on lateral portions of the etched second polysilicon film 30, the etched anti-polishing film 31 and the etched first oxide film 32. A second oxide film 36 is then deposited on the entire structure. At this time, a High Density Plasma (HDP) oxide film or a Spin On Glass (SOG) oxide film can be used as the second oxide film 36.

Figure 2D:
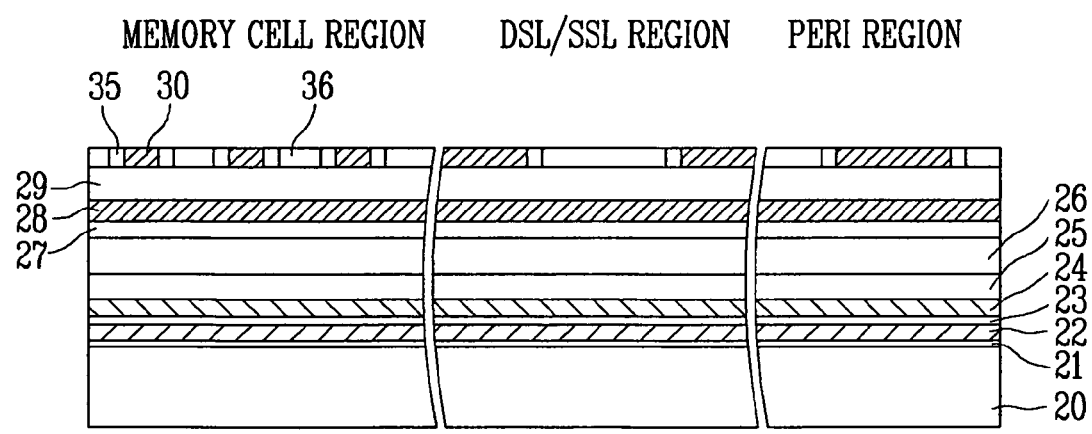

Thereafter, as shown in FIG. 2d, Chemical Mechanical Polishing (CMP) using the anti-polishing film 31 as a CMP stopper is performed on the entire surface, so that the second oxide film 36 and the first oxide film 32 are removed smoothly. An over (i.e., excessive) CMP process is then carried out to remove the anti-polishing film 31. Thereby, the second oxide film 36 and the second polysilicon film 30, which are separated from each other by the nitride film spacer 35, remain. At this time, although a subsequent process is performed with the anti-polishing film 31 not being removed, the anti-polishing film 31 can be removed when the nitride film spacer 35 is subsequently removed. Therefore, the above-mentioned over CMP process may be omitted.

Meanwhile, an arc-shaped shoulder portion on the nitride film spacer 35 is removed during the CMP process. Therefore, the nitride film spacer 35, the second oxide film 36 and the second polysilicon film 30 remaining after the CMP process rarely have CD variation depending on the height.

Figure 2E:
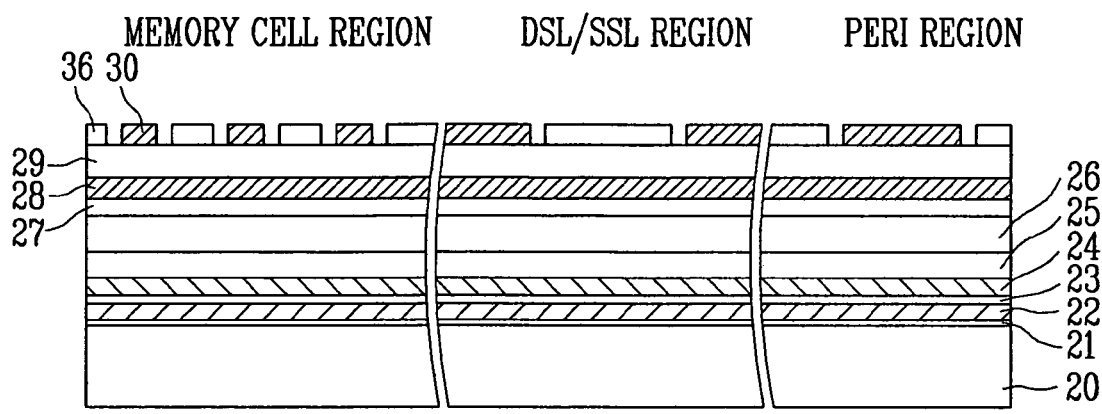

As shown in FIG. 2e, the nitride film spacer 35 is removed by the wet etch process. A wet etch process is then carried out in order to control a width of each of the second oxide film 36 and the second polysilicon film 30.

Figure 2F:
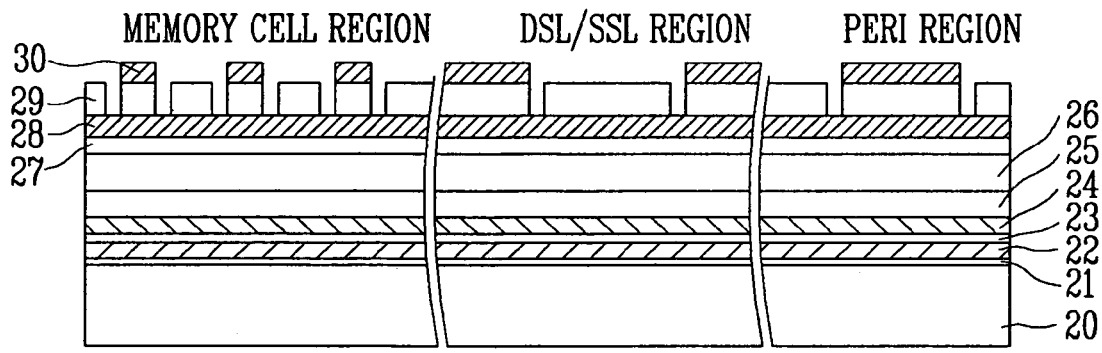

Thereafter, as shown in FIG. 2f, the underlying buffer oxide film 29 is etched using the second oxide film 36 and the second polysilicon film 30 as an etch barrier. At this time, the second oxide film 36 having the same etch selective ratio as that of the buffer oxide film 29 is also removed, but the second polysilicon film 30 having a different etch selective ratio from that of the buffer oxide film 29 remains on the buffer oxide film 29.

Figure 2G:
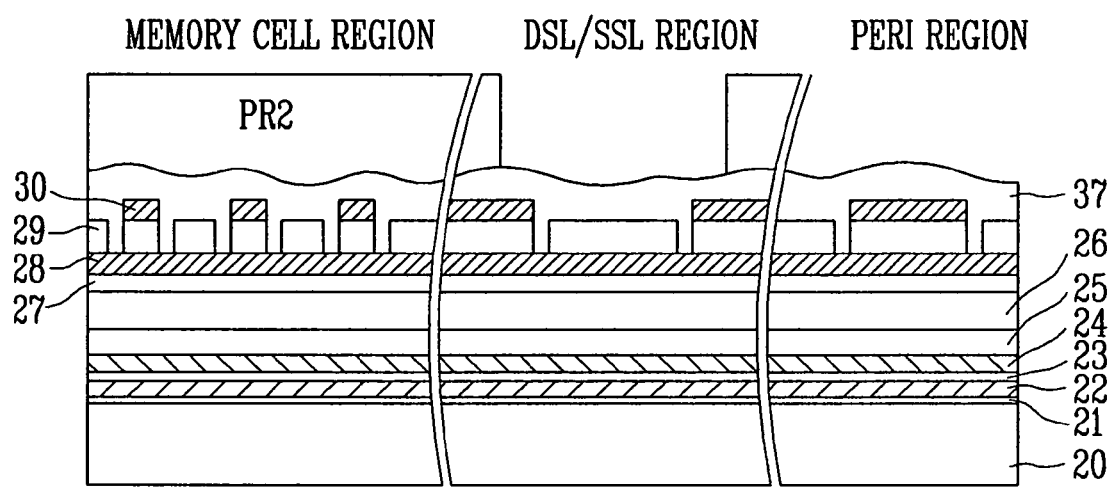
Figure 2H:
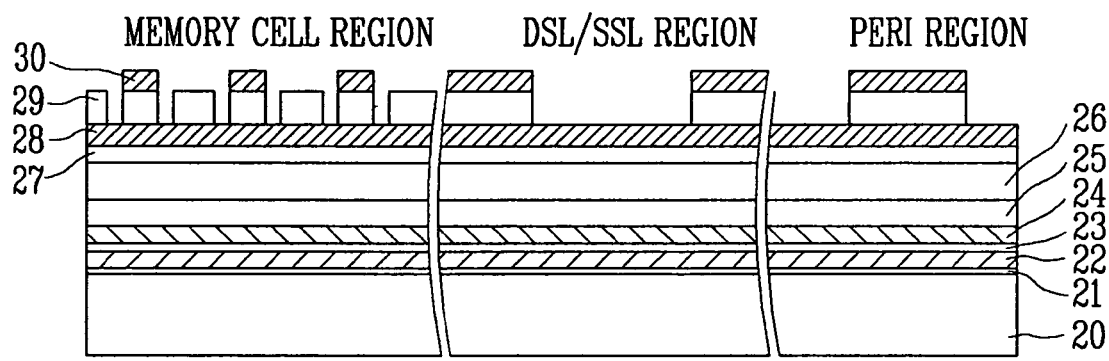

Thereafter, the buffer oxide film 29 formed in a region where the pattern should not be formed must be removed. To this end, as shown in FIG. 2g, a second anti-reflection film 37 and a second photoresist PR2 are sequentially formed on the entire structure. The second photoresist PR2 is patterned so that the second anti-reflection film 37 on the buffer oxide film 29 formed in the region where the pattern should not be formed is exposed. As shown in FIG. 2h, after the second anti-reflection film 37 and the buffer oxide film 29 are etched using the patterned second photoresist PR2 as a mask, the second photoresist PR2 and the second anti-reflection film 37 are removed.

At this time, when the buffer oxide film 29 is etched, etching is stopped by the first polysilicon film 28. Therefore, attack against the lower layer can be prevented. Furthermore, the second polysilicon film 30 and the buffer oxide film 29 have different etch selective ratios. Accordingly, the buffer oxide film 29 can be removed without significant loss of the second polysilicon film 30 although not only the buffer oxide film 29 but the top of the second polysilicon film 30 adjacent to the buffer oxide film 29 are opened by the second photoresist PR2. It is thus possible to sufficiently secure the overlay margin during the exposure process of the second photoresist PR2.

Figure 2I:
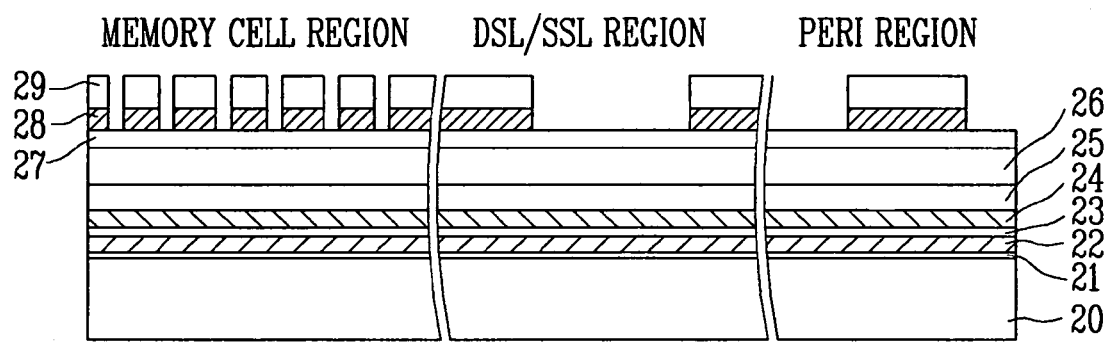

As shown in FIG. 2i, the first polysilicon film 28 is etched using the second polysilicon film 30 and the buffer oxide film 29 as etch barriers. At this time, the second polysilicon film 30 having the same etch selective ratio as that of the first polysilicon film 28 is removed, but the buffer oxide film 29 having a different etch selective ratio from that of the first polysilicon film 28 remains on the first polysilicon film 28. Meanwhile, when the first polysilicon film 28 is etched, attack against the lower layer can be prevented by the first protection layer 27.

Figure 2J:
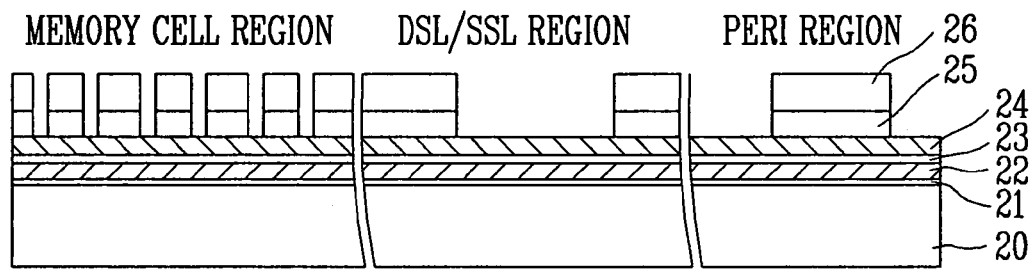

Referring to FIG. 2j, the first protection layer 27, the first α-carbon film 26 and the hard mask nitride film 25 are etched using the remaining buffer oxide film 29 and the remaining first polysilicon film 28 as an etch barrier. At this time, the buffer oxide film 29, and some of the first polysilicon film 28, the first protection layer 27 and the first α-carbon film 26 below are also removed, so that only the first α-carbon film 26 having a predetermined thickness remains on the hard mask nitride film 25.

Figure 2K:
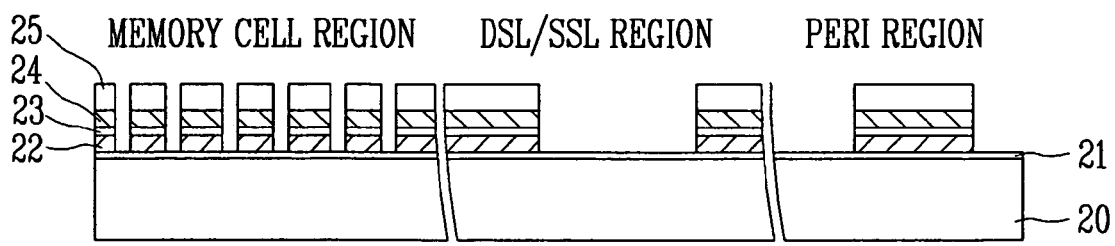

After the remaining first α-carbon film 26 is removed, the control gate conduction film 24, the dielectric film 23 and the floating gate conduction film 22 are patterned using the patterned hard mask nitride film 25 as an etch barrier, thereby forming a last gate pattern, as shown in FIG. 2k.

As described above, the invention may be applied to gate etch process of a flash memory device. However, the invention can be also applied to the entire range of etch processes necessary to fabricate semiconductor devices, such as a gate etch process, an isolation trench etch process, and a contact etch process of the entire semiconductor devices such as DRAM and SRAM.

As described above, the invention has at least the following advantages.

First, the CMP process is stopped by the anti-polishing film. Accordingly, the uniformity of the CMP process can be improved and pattern failure incurred by the irregularity of the CMP process can be prevented.

Second, a mask having a pitch smaller than the resolutions of an exposure apparatus can be formed using the second polysilicon film, the nitride film spacer and the first oxide film. The width of the mask can be reduced through the wet etch process. It is thus possible to form a pattern having a pitch smaller than a half of the resolutions of the exposure apparatus.

Third, since the pattern density is high, a cell pattern sensitive to the overlay accuracy can be formed by once exposure process not a dual exposure process. Variation in the pattern size, which is incurred by the shortage of the overlay margin of the dual exposure process, can be prevented.

Fourth, the buffer oxide film formed in a portion where a pattern should not be formed is removed using a difference in the etch selective ratio between the oxide film and the polysilicon film. Therefore, not only the buffer oxide film but the polysilicon film adjacent to the buffer oxide film can be exposed upon secondary exposure. Accordingly, the overlay margin at the time of secondary exposure can be improved.

Fifth, the etch margin can be improved using the α-carbon film. It is thus possible to prevent attack against a lower layer due to the shortage of the etch margin of the photoresist.

What is claimed is:

1. A method of forming a micro pattern in a semiconductor device, comprising the steps of:
    (a) sequentially forming a first polysilicon film and a buffer oxide film over the first polysilicon film on a semiconductor substrate having a to-be-etched layer, and forming a hard mask having a structure in which a second polysilicon film, an anti-polishing film and a first oxide film are laminated on a predetermined region of the buffer oxide film;
    (b) forming nitride film spacers on lateral portions of the hard mask and forming a second oxide film on the entire structure;
    (c) polishing the second oxide film, the nitride film spacers, and the first oxide film to expose the anti-polishing film, and removing the anti-polishing film and the nitride film spacers;
    (d) etching the buffer oxide film using the second polysilicon film and the second oxide film as masks and removing the second oxide film;
    (e) etching the first polysilicon film using the second polysilicon film and the buffer oxide film as masks and removing the second polysilicon film; and
    (f) etching the to-be-etched layer using the buffer oxide film and the first polysilicon film as masks.

2. The method of claim 1, further comprising the step of (g) removing a predetermined portion of the buffer oxide film, which is formed in a portion in which a pattern should not be formed, between step (d) and step (e).

3. The method of claim 2, wherein step (g) comprises the steps of:

(g1) sequentially forming a second anti-reflection film and a second photoresist over the anti-reflection film on the entire structure;

(g2) patterning the second photoresist to expose the second anti-reflection film on the buffer oxide film, which is formed in the portion in which the pattern should not be formed;

(g3) etching the second anti-reflection film and the buffer oxide film using the patterned second photoresist as a mask; and (g4) removing the second photoresist and the second anti-reflection film.

4. The method of claim 1, comprising forming a protection layer for protecting the underlying to-be-etched layer before forming the first polysilicon film.

5. The method of claim 4, comprising forming the protection layer to a thickness of 200 Å to 400 Å using a SiON film.

6. The method of claim 4, comprising forming a first α-carbon film before forming the protection layer.

7. The method of claim 6, comprising forming the first α-carbon film to a thickness of 1500 Å to 2500 Å.

8. The method of claim 1, comprising forming the first polysilicon film to a thickness of 500 Å to 600 Å and forming the second polysilicon film to a thickness of 500 Å to 700 Å.

9. The method of claim 1, comprising forming the buffer oxide film to a thickness of 400 Å to 500 Å and forming the first oxide film to a thickness of 800 Å to 1000 Å.

10. The method of claim 1, comprising forming the anti-polishing film to a thickness of 200 Å to 400 Å using a SiON film.

11. The method of claim 1, comprising forming the hard mask using the steps of:

sequentially forming the second polysilicon film and the anti-polishing film over the second polysilicon film and the first oxide film over the anti-polishing film on the entire surface of the buffer oxide film;

forming a second α-carbon film on the first oxide film;

coating a first photoresist on the second α-carbon film and patterning the first photoresist;

etching the second α-carbon film, the first oxide film, the anti-polishing film and the second polysilicon film using the patterned first photoresist as a mask; and removing first photoresist and the second α-carbon film that remain after the etch process.

12. The method of claim 11, comprising forming the second α-carbon film to a thickness of 1500 Å to 2500 Å.

13. The method of claim 11, comprising sequentially forming a second protection layer and an anti-reflection film before coating the first photoresist.

14. The method of claim 13, comprising forming the second protection layer to a thickness of 200 Å to 400 Å using a SiON film, and forming the anti-reflection film to a thickness of 200 Å to 400 Å.

15. The method of claim 1, comprising in step (c), first removing the anti-polishing film by an excessive polishing process and then removing the nitride film spacers.

16. The method of claim 1, comprising in step (c), removing the anti-polishing film and the nitride film spacers at the same time.

* * * * *